US011003019B2

(12) United States Patent
Engelen

(10) Patent No.: US 11,003,019 B2
(45) Date of Patent: May 11, 2021

(54) LIGHTING DEVICE FOR BACKLIGHTING OF DISPLAY SCREEN

(71) Applicant: Lumileds LLC, San Jose, CA (US)

(72) Inventor: Rob Jacques Paul Engelen, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/738,682

(22) Filed: Jan. 9, 2020

(65) Prior Publication Data

US 2020/0218117 A1 Jul. 9, 2020

(30) Foreign Application Priority Data

Jan. 9, 2019 (EP) ..................... 19151003

(51) Int. Cl.
*G02F 1/13357* (2006.01)
*F21V 8/00* (2006.01)
*G06F 1/16* (2006.01)

(52) U.S. Cl.
CPC ..... *G02F 1/133603* (2013.01); *G02B 6/0078* (2013.01); *G06F 1/1626* (2013.01)

(58) Field of Classification Search
CPC ............ G02F 1/133603; G02B 6/0078; G02B 6/0091; G02B 6/0068; G02B 6/0083; G02B 6/0073; G02B 6/0035; G02B 6/0051; G06F 1/1626; H01L 25/0753; H01L 23/00; H01L 23/02; H01L 23/0043; H01L 23/0047; H01L 23/0049; H01L 23/28; H01L 23/495
See application file for complete search history.

(56) References Cited

U.S. PATENT DOCUMENTS

| 8,471,284 B2* | 6/2013 | Lai ...................... H01L 25/0753 257/98 |
| 2008/0304262 A1* | 12/2008 | Takenaka ............... G03B 15/03 362/231 |
| 2009/0135625 A1 | 5/2009 | Yang et al. |
| 2010/0164921 A1* | 7/2010 | Ino ........................ G02F 1/1362 345/207 |
| 2011/0148816 A1* | 6/2011 | Jhu ....................... G06F 3/0428 345/175 |
| 2012/0044441 A1 | 2/2012 | Shigeta et al. |
| 2012/0200521 A1 | 8/2012 | Yoshimura |
| 2012/0230050 A1 | 9/2012 | Kim et al. |
| 2013/0010496 A1 | 1/2013 | Higashi et al. |
| 2013/0162932 A1 | 6/2013 | Han et al. |
| 2015/0144969 A1 | 5/2015 | Lee et al. |
| 2017/0332021 A1 | 11/2017 | Cui et al. |
| 2017/0337413 A1* | 11/2017 | Bhat .................. G06K 9/00087 |

* cited by examiner

*Primary Examiner* — Bao Q Truong
(74) *Attorney, Agent, or Firm* — Volpe Koenig

(57) ABSTRACT

A backlight for a display screen, an electronic device and a method of operating a backlight are described. A backlight includes a light guide, a lead frame, and at least one visible light-emitting diode (LED) and at least one infrared (IR) LED on the lead frame. The backlight includes at least one light entry face and a light exit face. The lead frame includes a first lead and a second lead isolated from each other. The at least one visible LED is optically coupled to one of the at least one light entry face and includes a counter electrode contacted by the first lead and an electrode contacted by the second lead. The at least one IR LED is optically coupled to one of the at least one entry face and includes a counter electrode contacted by the second lead and an electrode contacted by the first lead.

20 Claims, 4 Drawing Sheets

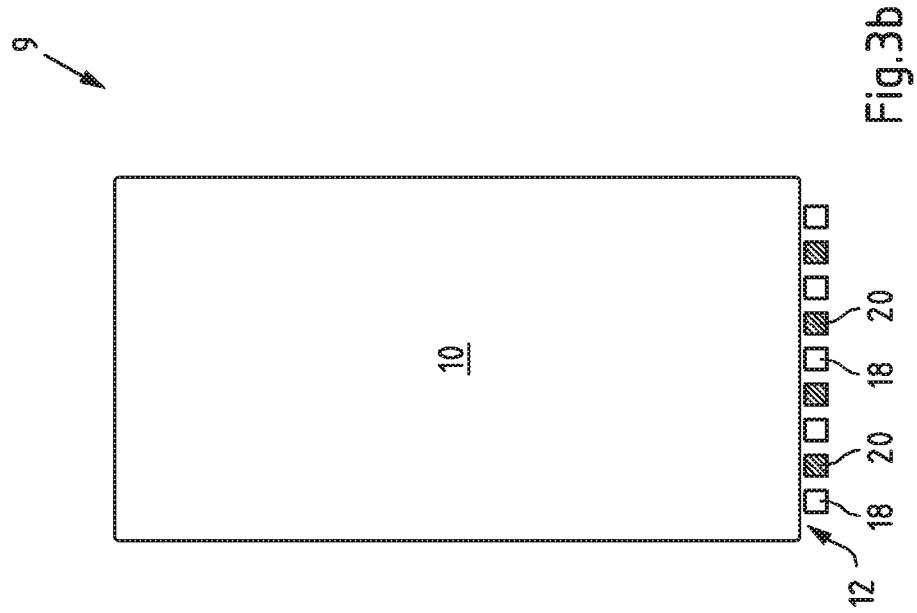
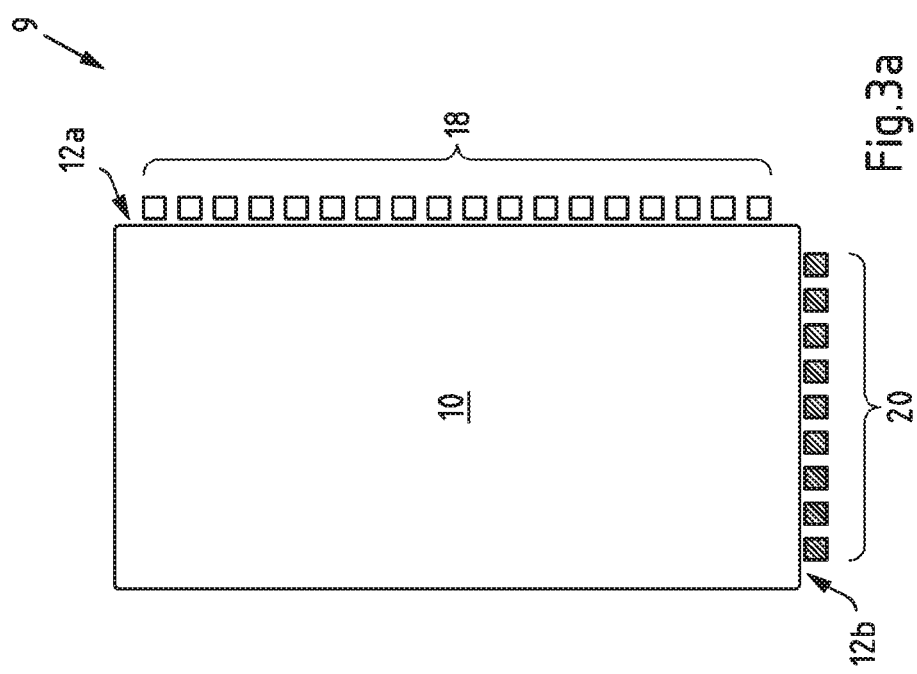

LIGHTING DEVICE FOR BACKLIGHTING OF DISPLAY SCREEN

FIELD OF INVENTION

The present disclosure relates to lighting devices for providing illumination in the infrared (IR) range in electronic devices with a display screen, in particular for identification purposes in mobile devices.

BACKGROUND

Optical imaging may be used for identification purposes based on biometric principles, for example optical iris and face identification. Biometric identification typically requires a dedicated light source. Light sources providing illumination in the IR range have been found to beneficial for identification, as IR light is able to reveal biometric features that cannot be detected by visible light. At the same time, an active IR light source may be invisible to the user, such that the user is not distracted by the lighting device for identification.

Systems for optical identification may also be integrated into mobile devices such as mobile phones. In mobile devices, the available space for each electronic element is highly restricted. Recently, there is a tendency to maximize the area of a display screen in mobile devices, such as the touchscreen of mobile phones. In some mobile devices, the display screen covers practically an entire face of the mobile device, significantly reducing or eliminating a bezel of the display screen.

Typically, only a small "notch" is left on the corresponding face of the mobile device for other devices than the display screen, e.g. cameras for visible light and IR light, a flash light as well as the IR lighting device for identification. In mobile device design, there is the need to further increase the coverage of the display screen by reducing the size of the notch, e.g. such that the display screen covers the entire face, optionally only with a camera remaining in the notch at a corner of the display screen. Hence, it is desirable to configure the IR lighting device such that only very little available space for the display screen is consumed at the face of the mobile device.

In principle, it is possible to arrange the IR lighting device at an edge or the back side of the mobile device and to use light guides to redirect the light provided by the IR lighting device around the display screen and towards the front side of the mobile device. However, the efficiency of such arrangements is typically rather low. At the same time, still a significant amount space at the front face is consumed by the light guides, reducing the available size of the display screen.

SUMMARY

It is an object of the present invention to provide a lighting device for providing illumination in the IR range in particular for mobile devices with a display screen, wherein the lighting device optimizes the available space for the display screen. The invention further relates to an electronic device comprising a lighting device and a display screen, as well as to a use of a lighting device based on the aforementioned object.

According to a first aspect of the present invention, a lighting device for providing backlighting to a display screen is provided, the lighting device comprising: a light guide comprising at least one light entry face and a light exit face, wherein the light guide is configured to redirect light entering the light entry face towards the light exit face, wherein the light exit face is configured to be coupled to a back side of a display screen; at least one visible light-emitting diode (LED) capable to emit light in the visible range, wherein the visible LED is optically coupled to at least one light entry face; and at least one IR LED capable to emit light in the IR range, wherein the at least one IR LED is configured to provide illumination for the light exit face.

According to a second aspect of the present invention, an electronic device is provided, comprising the lighting device according to the first aspect and a display screen, wherein the light exit face of the lighting device is coupled to a back side of the display screen.

According to a third aspect of the present invention, a use of a lighting device according to the first aspect for optical identification is provided, in particular face identification and/or iris identification.

According to a fourth aspect of the present invention, a light-emitting element is provided, in particular for use in a lighting device according to the first aspect, the light-emitting element comprising: at least one IR LED and at least one visible LED, wherein the at least one IR LED is arranged adjacent to the at least one visible LED, wherein the at least one IR LED and the at least one visible LED are at least partially encapsulated in a common package.

Exemplary embodiments of the first, second, third, and fourth aspect of the invention may have one or more of the properties described below.

With the present invention, it has been found that an IR light source may be beneficially integrated into a lighting device for providing backlighting to the display screen, such that it is possible to provide a lighting device in particular for identification purposes practically without any restriction to the size of the display screen. In particular, with the lighting device according to the invention, the display screen may essentially cover an entire face of an electronic device, while light in the IR range may be provided with high efficiency by means of the lighting device. In principle, it is also possible to use a lighting device according to the invention in conjunction with already existing display screen configurations.

The lighting device is configured for providing backlighting to a display screen. The display screen is configured for presenting visual information, for instance in a two-dimensional configuration. The display screen is a backlit display screen and may be at least partially a passive screen. That is, the display screen is configured to modulate the light provided by the lighting device to provide a visual display of information.

The lighting device comprises at least one visible LED capable to emit light in the visible range, wherein the light emitted by the visible LED is used to illuminate the display screen from the back side. A light guide is provided, the light guide comprising at least one light entry face and a light exit face. The light guide is configured to redirect light entering the light entry face towards the light exit face. The at least one visible LED is optically coupled to at least one light entry face in that light emitted by the visible LED may enter the light entry face. For example, the at least one visible LED is arranged adjacent to the light entry face, wherein a light-emitting face of the visible LED faces the light entry face. Therefore, the light guide may provide the visible backlight for the display screen based on the light emitted by the at least one visible LED. The light guide may comprise reflective elements and/or may comprise at least one surface for total internal reflection to obtain a redirection of light towards the light exit face. The light guide comprises material that is at least partially transparent in the wavelength ranges emitted by the at least one visible LED and the at least one IR LED.

The light exit face is configured to be coupled to a back side of a display screen. For instance, the light exit face may comprise a shape that is adapted to the shape of the display screen, such as a rectangular shape and/or planar shape, wherein the light exit face of the light guide has substantially identical dimensions as the back side of the display screen. In particular, the light guide may be configured such that in conjunction with the arrangement of the at least one visible LED, the light exit face may provide a substantially homogeneous illumination. That is, the light exit face may have a substantially constant illuminance across the surface when the at least one visible LED is active to provide a homogeneous backlighting for the display screen. Optionally, diffusing elements may be used to improve the homogeneity of the illumination.

According to the invention, the lighting device for backlighting additionally comprises at least one IR LED capable to emit light in the IR range. The at least one IR LED is configured to provide illumination for the light exit face. Hence, the lighting device may also provide an illumination with IR light by means of a display screen, which is otherwise based on visible light to visualize information. Hence, with the lighting device according to the invention, a separate IR light source that consumes space that otherwise be available for the display screen may be omitted. Here, the IR LED is advantageously incorporated into the lighting device for providing backlighting for the display screen, such that the display screen size may be optimized. At the same time, the at least one IR LED may provide for an illumination with IR light of the display screen in regions or over the entire display screen, such that an illumination over a large area is obtained, for instance for identification purposes.

The IR LED and/or visible LED may comprise at least one semiconductor element such as a p-n-junction, a diode, and/or a transistor. For instance, the visible LED and/or IR LED may be provided in form of separate or combined LED dies and/or LED packages, wherein particular at least one LED may be arranged on a substrate.

The IR LED and visible LED may be characterized by the peak wavelength, i.e. the wavelength with the maximum in emitted intensity. That is, the at least one IR LED may have a peak wavelength in the IR range, e.g. above 780 nm. In particular, the peak wavelength of the IR LED may be in the near IR range, e.g. from 780 nm to 3000 nm, in particular from 800 nm to 1100 nm. In some embodiments, the at least one IR LED may have a peak wavelength in the range of 800 nm to 1000 nm. Similarly, the visible LED may have a peak wavelength in the visible range, e.g. from 380 nm to 780 nm. In particular, red LEDs, green LEDs and/or blue LEDs may be used as visible LEDs in the lighting device. The visible LED and/or IR LED may for instance comprise a wavelength conversion element (e.g. based on phosphor). For example, a blue LED may be used as visible LED with a wavelength conversion element to provide a white backlight for the display screen. The visible LED and/or IR LED may also comprise at least one optical element such as a diffractive element (e.g. a lens) and/or a reflective element (e.g. reflecting elements such as a reflecting cup).

As described above, the at least one IR LED also provides illumination of the light exit face. The at least one IR LED may be arranged such that a direct illumination of the light exit face is possible, i.e. the light emitted by the IR LED is at least partially not reflected in the light guide. In an exemplary embodiment according to the invention, the at least one IR LED is arranged at a back face of the light guide, in particular to provide such a direct illumination of the light exit face.

In another exemplary embodiment of the present invention, the at least one IR LED is coupled to at least one light entry face. Similar to the arrangement of the at least one visible LED, the light guide is then configured to redirect the IR light emitted by the IR LED and entering the light entry face towards the light exit face. In particular, the light exit face may provide a substantially homogeneous illumination of the back side of the display screen with IR light.

In another exemplary embodiment according to the invention, the at least one light entry face is arranged on an edge of the light guide. The lighting device may therefore be configured as edgelit backlight for a display screen. For instance, the light guide may have a substantially plate-like shape with two main faces, wherein one of the main faces represents the light exit face. The light exit face may have a substantially rectangular shape. At least one of the edges of the plate-like shape, i.e. at least one of the smaller faces of the plate-like shape, may represent the light entry face. More than one edge may be used as light entry face. For instance, two edges may be used as light entry faces, with the two edges having normal direction being arranged at an angle to each other, in particular substantially perpendicular to each other. Optionally, all edges of the light guide are configured as light entry faces.

In another exemplary embodiment according to the invention, the lighting device further comprises a back reflector arranged on a back face of the light guide opposite the light exit face. In particular in the aforementioned configuration as an edgelit backlight, a back reflector may provide simple and effective means to redirect the light entering the light entry face(s) towards the light exit face. In a plate-like configuration of the light guide, the main face opposite the light exit face may represent the back face. The back reflector is in particular configured as reflective layer, for instance a reflective coating on the back side of the light guide.

In another exemplary embodiment according to the invention, the at least one visible LED and the at least one IR LED are coupled to the same light entry face. That is, in case of multiple light entry faces, at least one of the light entry faces is optically coupled to at least one visible LED and at least one IR LED. The illumination with visible light and the illumination with IR light may therefore be effected by the light guide in a similar manner, e.g. by reflection on the same surface and/or reflective element.

In case the lighting device comprises multiple visible LEDs and/or multiple IR LEDs being arranged alternating at the same light entry face, the homogeneity of the illumination may be further improved. For instance, multiple LEDs are arranged adjacent to each to other and are coupled to the same light entry face. The type of LEDs may then be alternating, e.g. directly alternating wherein each neighbouring LED is of a different type (IR—visible—IR—visible—etc.) or with alternating groups of types of LEDs, e.g. groups of two (IR—IR—visible—visible—IR—IR—etc.) or more.

In another exemplary embodiment according to the invention, the light guide comprises multiple light entry faces, and at least one visible LED and at least one IR LED are coupled to different light entry faces. Separating the at least one visible LED and the at least one IR LED may be advantageous in view of minimizing the space required to accommodate the LEDs. Further, the optical properties of the light guide with respect to the illumination with visible light and the IR light may be optimized. For instance, the different light entry faces may lead to a different illumination profile. In an embodiment, the at least one visible LED provides for a substantially homogenous illumination of the light exit face by means of the light guide. The at least one IR LED may provide for a different type of illumination, e.g. by being coupled to a light entry face being configured differently in comparison to the light entry face of the visible LED.

In another exemplary embodiment according to the invention, the at least one visible LED is configured for an edge emission. That is, the at least one visible LED may have a substantially cuboid shape with main faces and edge faces. At least one of the edge faces is a face with the highest emitted intensity. The edge-emitting visible LED may be arranged within at least one light guiding tile of the light guide. The at least one IR LED may also be arranged adjacent to the at least one edge-emitting visible LED. The light guiding tile may have a substantially cuboid shape with main faces, wherein one of the main faces forms at least a part of the light exit face and the opposite main face forms at least part of the back face. The edge-emitting visible LED may emit the highest intensity of light in a direction substantially parallel to the main faces. In particular, the edge-emitting visible LED may be arranged in a central region of the main face forming the back side of the light guide.

Further, the at least one light guiding tile may comprise an outcoupling structure arranged on a back face of the light guide opposite the light exit face. The outcoupling structure may for example comprise reflective and/or diffusive elements. In some embodiments, the back face of light guide formed by the light guiding tile has a shape suitable for total internal reflection of the light emitted by the LED, e.g. a cup-like shape.

In another exemplary embodiment according to the invention with the at least one IR LED being arranged adjacent to the at least one visible LED, the at least one IR LED and the at least one visible LED are combined in a common package. For instance, the at least one IR LED and the at least one visible LED may be encased and/or encapsulated in a single element. The common package may comprise reflective elements and may be configured as reflective package. By surrounding the IR LED and the visible LED together within a reflective package, the amount of light coupled into the light entry face may be improved, while the LEDs may be mounted together in the lighting device in a particularly simple manner. Further, the combination of LEDs according to the invention may be produced in a particularly simple manner.

The common package may be configured as a "white" package, wherein the white package for instance comprises "white" walls encapsulating the IR LED and the visible LED with highly reflective material, such as silicone. Reflective particles such as TiOx particles may be embedded in the silicone. The common package may comprise side walls for the LEDs in particular comprise a common or separate substrate and/or lead frame for at least one LED coated with a reflective material.

In another exemplary embodiment according to the invention, an electrode of the at least one IR LED and a counter electrode of the at least one visible LED are contacted by a first lead. A counter electrode of the at least one IR LED and an electrode of the at least one visible LED are contacted by a second lead. For example, the cathode of the IR LED and the anode of the visible LED are contacted by the first lead, while the anode of the IR LED and the cathode of the visible LED are contacted by the second lead. That is, the IR LED and the visible LED are contacted to the first and second lead with different polarities. Hence, the electrical connections to the LEDs such as a PCB layout are simplified, wherein for example only two leads are required to provide a pair of LEDs with power. The visible LED and the IR LED may be activated independently of each other. For instance, a positive voltage between first and second lead may activate the visible LED (with the IR LED being inactive), while a negative voltage may activate the IR LED (with the visible LED being inactive).

The electronic device according to the second aspect of the invention comprises a display screen, wherein the light exit face of the lighting device according to the first aspect of the invention is coupled to a back side of the display screen. That is, the lighting device is arranged to provide backlighting for the display screen.

As already mentioned above, the display screen is therefore configured as a backlit display screen and may be at least partially a passive screen. The display screen is configured to modulate the light provided by the lighting device to provide a visual display of information, for instance by a modulation in intensity and/or colour. The modulation by the display screen may be effected by an optical film element. In an exemplary embodiment according to the invention, the display screen is configured as an LCD screen. For example, the optical film element may comprise at least one optical element/optical film with liquid crystals for the modulation of light.

According to another exemplary embodiment of the invention, a diffusion film element is provided, wherein the diffusion film element is arranged in between the light exit face and the optical film element. The diffusion film element may provide for a more homogeneous illumination of the optical film element and therefore for a more homogenous display of information.

In another exemplary embodiment according to the invention, the electronic device is configured as mobile device. The electronic device may for instance be configured as a portable computer, such as a laptop computer, a tablet computer, a wearable, a thin client, a personal digital assistant or a smartphone. The electronic device may be configured for optical identification, authentication and/or biometry, for instance for an identification based on iris and/or face recognition. The electronic device comprising the lighting device may also be configured for machine vision. The electronic device may be configured to perform the optical identification and/or machine vision as a standalone system or in conjunction with other devices. For example, the electronic device may be configured to connect to a network to perform optical identification and/or machine vision together with other devices connected to the network.

In the light-emitting element according to the fourth aspect of the invention, the at least one IR LED and the at least one visible LED are at least partially encased and/or encapsulated in a single element. The at least one IR LED and the at least one visible LED may be arranged on a common substrate such as a (printed) circuit board/lead frame and the common substrate may at least partially be overmoulded with an encapsulating material, e.g. with silicone. The light-emitting element may therefore be produced in a particularly simple manner. The common package may comprise reflective elements and may be configured as reflective package. By encapsulating the IR LED and the visible LED together within a reflective package, the amount of emitted light may be improved. The common package may be configured as a "white" package, wherein the white package for instance comprises "white" walls encapsulating the IR LED and the visible LED with highly reflective material, such as silicone. Reflective particles such as TiOx particles may be embedded in the silicone.

In an embodiment of the light-emitting element, an electrode of the at least one IR LED and a counter electrode of the at least one visible LED are contacted by a first lead, and a counter electrode of the at least one IR LED and an electrode of the at least one visible LED are contacted by a second lead.

The features and example embodiments of the invention described above may equally pertain to the different aspects according to the present invention. In particular, with the disclosure of features relating to the lighting device according to first aspect also corresponding features relating to the use according to the third aspect and the light-emitting element according to the fourth aspect are disclosed.

It is to be understood that the presentation of embodiments of the invention in this section is merely exemplary and non-limiting.

Other features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

BRIEF DESCRIPTION OF THE DRAWING(S)

Examples of the invention will now be described in detail with reference to the accompanying drawing, in which.

Figure 4A:
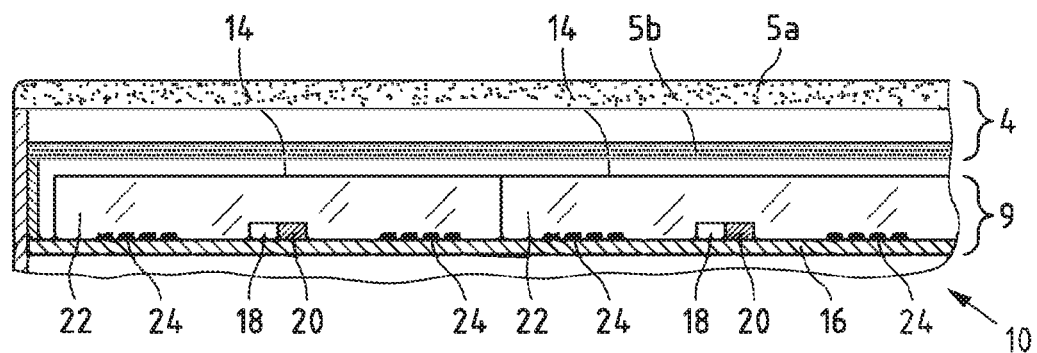
Figure 5:
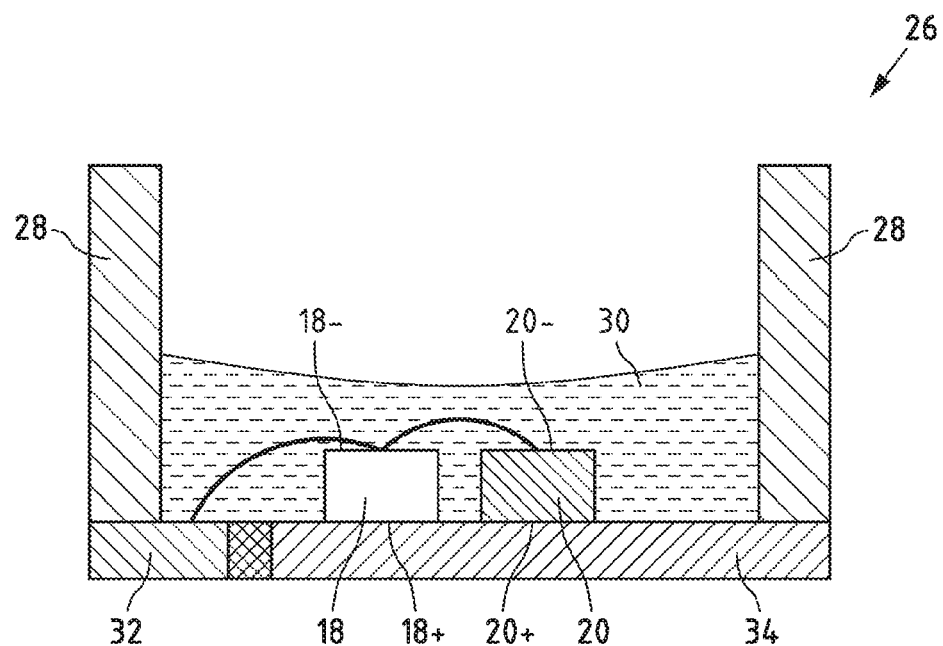

FIGS. 3a,b show examples of arrangements of visible LEDs and IR LEDs in embodiments of the lighting device according to the invention;

FIGS. 4a,b show further embodiments of the lighting device according to the invention; and FIG. 5 shows a schematic representation of a light-emitting element comprising a visible LED and an IR LED in a common package.

DETAILED DESCRIPTION OF THE PREFERRED EMBODIMENT(S)

Figure 1:
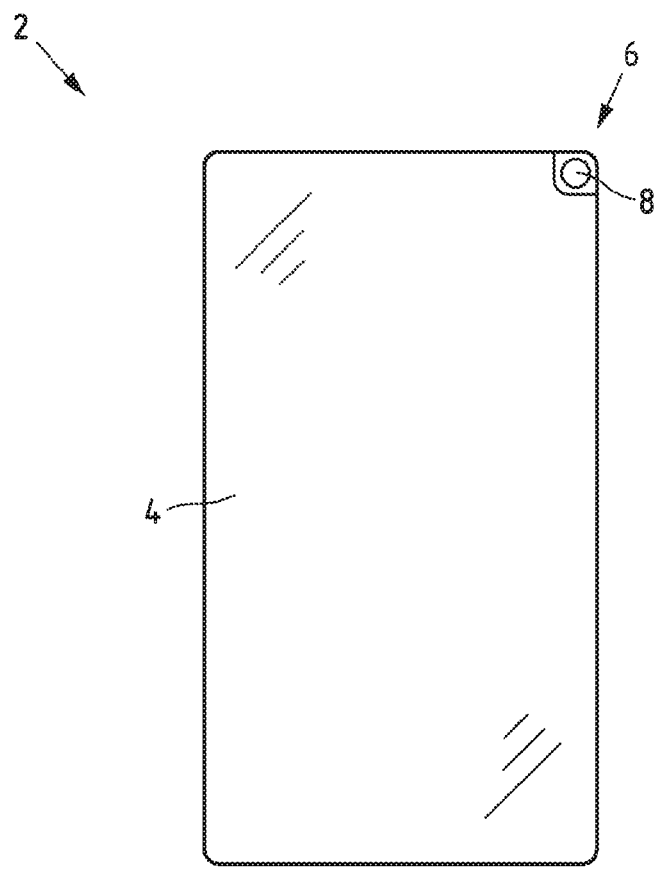
FIG. 1 shows a schematic representation of an electronic device comprising a display screen according to the invention.

FIG. 1 shows a schematic representation of an electronic device 2 comprising a display screen 4 according to the invention. The electronic device 2 is configured as a mobile phone with the display screen 4 being a LCD screen. The display screen 4 almost covers the entire face of the electronic device 2 depicted in FIG. 1, only leaving a small "notch" 6 in a corner of the face, wherein the notch 6 accommodates a camera 8. With the present invention, such a high coverage of the display screen 4 may be combined with an IR light source, e.g. for identification purposes.

Figure 2:
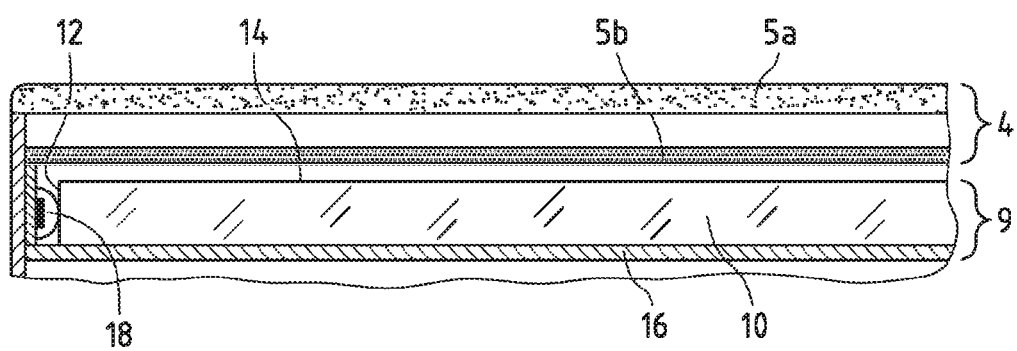
FIG. 2 shows a schematic representation of a cross section of a display screen region of the electronic device according to the invention.

FIG. 2 shows a schematic representation of a cross section of a display screen region of the electronic device 2. The electronic device 2 comprises a lighting device 9 for providing backlighting to the display screen 4. The display screen 4 is configured as an LCD screen and comprises an optical film element 5a with liquid crystals and a diffusion film element 5b. The diffusion film element 5b is arranged in between the light exit face 14 and the optical film element 5a.

A light guide 10 comprises a light entry face 12 and a light exit face 14. The light guide 10 is configured to redirect light entering the light entry face 12 towards the light exit face 14 by means of reflection at a back reflector 16 arranged on a back face of the light guide 10 opposite of the light exit face 14. The light exit face 14 is coupled to a back side of the display screen 4.

The light entry face 12 is arranged on an edge of the light guide 10, with a visible LED 18 being optically coupled to the light entry face 12. The lighting device 9 is therefore configured as an edgelit backlight for the display screen 4. The visible LED 18 is capable of emitting light in the visible range and is configured as blue LED with a wavelength conversion element to produce white light.

Further, at least one IR LED capable to emit light in the IR range is provided. FIGS. 3a and 3b show examples of arrangements of visible LEDs 18 and IR LEDs 20 in a schematic front view of the lighting device 9. In FIG. 3a, the light guide 10 comprises multiple light entry faces 12a, 12b, which are formed at edges of the light guide 10, the light guide 10 having a plate-like shape. The visible LEDs 18 and the IR LEDs 20 are arranged at different light entry faces 12a, 12b, respectively.

As the IR LEDs 20 are incorporated into the lighting device that provides backlight for the display screen 4, a separate IR light source may be omitted. Hence, the size of the display screen 4 may be optimized.

FIG. 3b shows an alternative arrangement to FIG. 3a, wherein one light entry face 12 is provided and the visible LEDs 18 and the IR LEDs 20 are coupled to the same light entry face 12. Multiple visible LEDs 18 and multiple IR LEDs 20 are arranged alternating at the same light entry face 12.

Figure 4B:
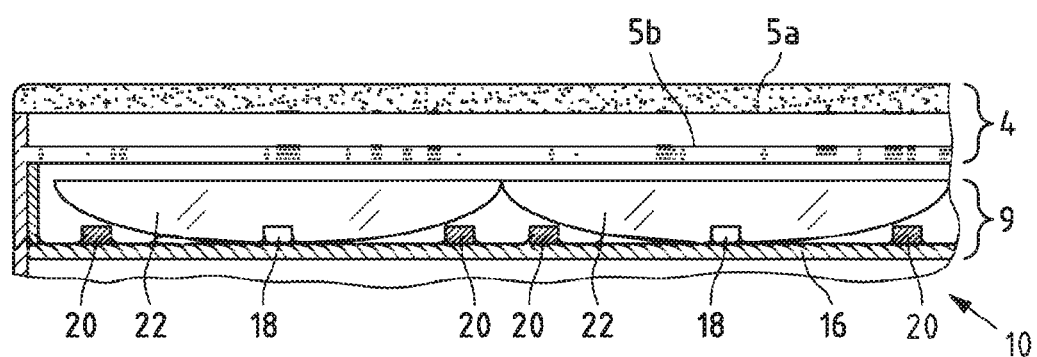

FIGS. 4a and 4b show further embodiments of the lighting device 9 according to the invention. Here, the light guide 10 comprises light guiding tiles 22. The light guiding tiles 22 comprise an outcoupling structure 24 arranged on the back face of the light guide 10 opposite the light exit face 14. The outcoupling structure 24 in FIG. 4a is configured as reflective elements being embedded in the light guiding tile 22. The visible LEDs 18 are configured for an edge emission in that the main emission direction is substantially parallel to the light exit face 14. The visible LEDs 18 are arranged within the guiding tile 22 of the light guide 10, such that the light emitted by the visible LEDs 18 is redirected towards the light exit face 14 at the outcoupling structure 24. IR LEDs 20 are arranged adjacent to the visible LEDs 18, wherein the IR light emitted by the IR LEDs 20 also enters the light guiding tiles 22 and is redirected towards the light exit face 14.

In the embodiments shown in FIGS. 3a, 3b and 4a, the IR LEDs 20 are configured to provide illumination for the light exit face 14 in that the IR LEDs 20 are also coupled to an light entry face 12. The light emitted by the IR LEDs 20 is then also redirected by the light guide 10 by reflection.

As an alternative, the IR LEDs 20 may be configured to provide illumination for the light exit face 14 by a substantially direct illumination, e.g. without reflection. FIG. 4b shows an embodiment of a lighting device 9 with light guiding tiles 22, wherein the outcoupling structure 24 of the light guiding tiles 22 is provided by the shape of the back side of the light guiding tiles 22. The back side is configured in a cup-like shape, with the light emitted by the visible LEDs 18 being at least partially reflected at the back side by total internal reflection. The IR LEDs 20 are arranged at a back side of the light guide 10 and may emit light directly towards the light exit face 14 without being reflected at the outcoupling structure 24.

FIG. 5 shows a schematic representation of a light-emitting element 26 comprising a visible LED 18 and an IR LED 20 being combined in a common package. The light-emitting element 26 may be used in the lighting device 9 according to the invention. The IR LED 20 is arranged adjacent to the visible LED 18 with the LEDs being encapsulated in a single element.

The common package is configured as a "white" package, with side walls 28 made of reflective white silicone surrounding the visible LED 18 and the IR LED 20. The visible LED 18 and the IR LED 20 are further encapsulated by a transparent filler 30 made of transparent silicone.

The visible LED 18 and the IR LED 20 are arranged on a common lead frame with a first lead 32 and a second LED 34 being isolated from each other.

The anode 18+ of the visible LED 18 and the cathode 20− of the IR LED 20 are contacted by the first lead 32. The cathode 18− of the visible LED 18 and the anode 20+ of the IR LED 20 are contacted by the second lead 34. Hence, by choosing the polarity of the voltage applied to the first lead 32 and the second lead 34, it can be chosen whether the visible LED 18 or the IR LED 20 is activated.

It will be understood that all presented embodiments are only exemplary, and that any feature presented for a particular exemplary embodiment may be used with any aspect of the invention on its own or in combination with any feature presented for the same or another particular exemplary embodiment and/or in combination with any other feature not mentioned. It will further be understood that any feature presented for an example embodiment in a particular category may also be used in a corresponding manner in an example embodiment of any other category.

What is claimed is:

1. A backlight for a display screen comprising:
   a light guide comprising at least one light entry face and a light exit face;
   a lead frame comprising a first lead and a second lead isolated from each other;
   at least one visible light-emitting diode (LED) on the lead frame and optically coupled to one of the at least one light entry face, the at least one visible LED comprising a counter electrode contacted by the first lead and an electrode contacted by the second lead; and
   at least one infrared (IR) LED on the lead frame and optically coupled to one of the at least one entry face, the at least one IR LED comprising a counter electrode contacted by the second lead and an electrode contacted by the first lead.

2. The backlight according to claim 1, wherein the light guide is configured to redirect light entering the light entry face towards the light exit face.

3. The backlight according to claim 1, wherein the light exit face is configured to be coupled to a backside of the display screen.

4. The backlight according to claim 1, wherein the at least one light face is disposed at an edge of the light guide.

5. The backlight according to claim 1, further comprising a back reflector on a back face of the light guide opposite the light exit face.

6. The backlight according to claim 1, wherein the at least one light entry face comprises one light entry face, and the at least one visible LED and the at least one IR LED are coupled to the one light entry face.

7. The backlight according to claim 6, wherein:
   the at least one visible LED comprises a plurality of visible LEDs,
   the at least one IR LED comprises a plurality of IR LEDs, and the plurality of visible LEDs and the plurality of IR LEDs are arranged alternating at the one light entry face.

8. The backlight according to claim 1, wherein the at least one light entry face comprises a plurality of light entry faces, and the at least one visible LED and the at least one IR LED are coupled to different light entry faces of the plurality of light entry faces.

9. The backlight according to claim 1, wherein:
   the light guide further comprises at least one light guiding tile that comprises an outcoupling structure on a back face of the light guide opposite the light exit face,
   the at least one visible LED is configured for edge emission, has a substantially cuboid shape with main faces and edge faces with at least one of the edge faces being a face with a highest emitted intensity, and is arranged within the at least one light guiding tile of the light guide.

10. The backlight according to claim 1, wherein:
    at least one of the at least one IR LED is adjacent at least one of the at least one visible LED, and
    the at least one IR LED and the at least one visible LED are provided in a common package.

11. The backlight according to claim 1, wherein the at least one visible LED and the at least one IR LED are activated by choosing a polarity of a voltage applied to the first lead and the second lead.

12. An electronic device comprising:
    a display screen;
    a light guide comprising at least a light exit face coupled to a backside of the display screen and at least one light entry face;
    a lead frame comprising a first lead and a second lead isolated from each other;
    at least one visible light-emitting diode (LED) on the lead frame and optically coupled to one of the at least one light entry face, the at least one visible LED comprising a counter electrode contacted by the first lead and an electrode contacted by the second lead; and
    at least one infrared (IR) LED on the lead frame and optically coupled to one of the at least one entry face, the at least one IR LED comprising a counter electrode contacted by the second lead and an electrode contacted by the first lead.

13. The electronic device according to claim 12, wherein:
    the display screen comprises an optical film element and a diffusion film element, and
    the diffusion film is between the light exit face and the optical film element.

14. The electronic device according to claim 12, wherein the electronic device is a mobile device.

15. The electronic device according to claim 12, further comprising a case having a first face, wherein the display screen covers the entire first face of the case.

16. The electronic device according to claim 12, further comprising a case having a first face, wherein the display screen covers the entire first face of the case except for a portion covered by a camera module.

17. The electronic device according to claim 12, wherein the light guide is configured to redirect light entering the light entry face towards the light exit face.

18. A method of operating a backlight for a display screen, the method comprising:
   applying a voltage having a first polarity to a first lead and a second lead of a lead frame to activate at least one infrared (IR) light-emitting diode (LED) on the lead frame that comprises a counter electrode contacted by the second lead and an electrode contacted by the first lead to emit IR through a light guide to a display screen; and
   applying a voltage having a second polarity to the first lead and the second lead of the lead frame to activate at least one visible LED on the lead frame that comprises a counter electrode contacted by the second lead and an electrode contacted by the second lead to emit visible light through the light guide to the display screen.

19. The method of claim 18, wherein the voltage having the first polarity is applied to the first lead and the second lead to perform at least one of face identification and iris identification.

20. The method of claim 18, wherein the voltage having the second polarity is applied to the first lead frame and the second lead frame to display a visible image on the display screen.

* * * * *